Figure 1:
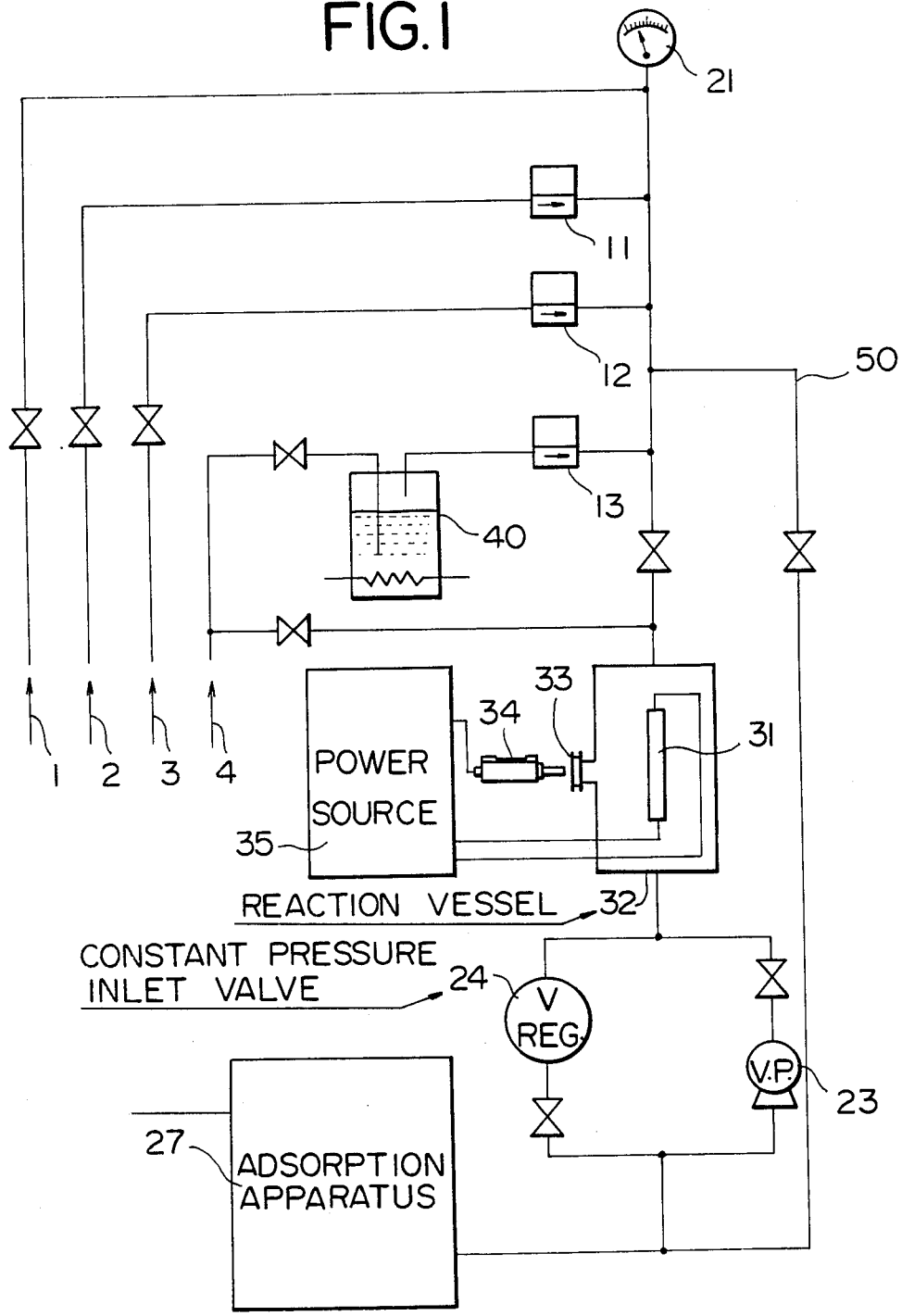

United States Patent [19]

Maruya et al.

[11] Patent Number: 4,857,270
[45] Date of Patent: Aug. 15, 1989

[54] PROCESS FOR MANUFACTURING SILICON-GERMANIUM ALLOYS

[75] Inventors: Shinji Maruya, Hiratsuka; Yoshifumi Yatsurugi, Fujisawa; Kazuya Togashi, Tokyo, all of Japan

[73] Assignee: Komatsu Electronic Metals Co., Ltd., Kanagawa, Japan

[21] Appl. No.: 184,002

[22] Filed: Apr. 20, 1988

[30] Foreign Application Priority Data

May 19, 1987 [JP] Japan .................. 62-120319

[51] Int. Cl.$^4$ ............................... C23C 14/14
[52] U.S. Cl. .......................... 420/578; 148/33.6; 148/DIG. 59; 156/613; 420/556; 437/110; 437/131
[58] Field of Search ............... 148/33.6, DIG. 59; 156/613; 420/556, 578; 437/110, 131

[56] References Cited

U.S. PATENT DOCUMENTS

| | | | |
|---|---|---|---|
| 2,552,626 | 5/1951 | Fisher et al. | 420/578 |
| 3,058,854 | 10/1962 | Angello | 420/578 |
| 3,173,814 | 3/1965 | Law | 437/110 |
| 3,279,954 | 10/1966 | Cody et al. | 420/578 |
| 3,338,760 | 8/1967 | Brownson | 437/131 |
| 3,496,037 | 2/1970 | Jackson, Jr. et al. | 156/613 |
| 3,508,915 | 4/1970 | Paoli | 420/578 |
| 3,898,080 | 8/1975 | Penn | 420/578 |
| 4,442,449 | 4/1984 | Lehrer et al. | 420/578 |
| 4,521,447 | 6/1985 | Ovshinsky et al. | 437/131 |
| 4,529,455 | 7/1985 | Bean et al. | 437/131 |

FOREIGN PATENT DOCUMENTS

| | | | |
|---|---|---|---|
| 0061388 | 9/1982 | European Pat. Off. | 420/556 |
| 0185499 | 6/1986 | European Pat. Off. | 420/578 |
| 0004175 | 2/1970 | Japan | 420/578 |
| 0509824 | 8/1971 | Switzerland | 437/131 |

OTHER PUBLICATIONS

Halberg et al., "Silicon Germaniun Alloy . . . ", Chem. Ab. 97:137724m, vol. 97, p. 722, 1982.

*Primary Examiner*—L. Dewayne Rutledge
*Assistant Examiner*—David Schumaker
*Attorney, Agent, or Firm*—Larson and Taylor

[57] ABSTRACT

A process for manufacturing a silicon-germanium alloy comprising introducing SiH$_4$ gas, GeCl$_4$ gas and P-type or N-type doping gas into a reaction vessel, heating a substrate up to a temperature not lower than 750° C., and depositing a thickly-grown, bulky silicon-germanium alloy upon the substrate within the reaction vessel.

3 Claims, 2 Drawing Sheets

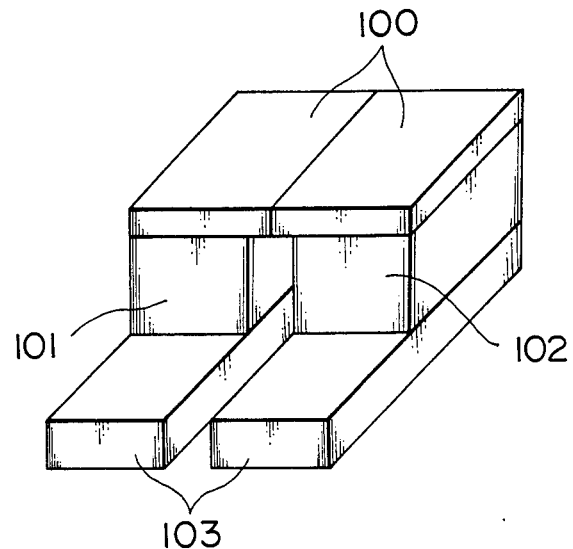

PROCESS FOR MANUFACTURING SILICON-GERMANIUM ALLOYS

This invention relates to a process suitable for manufacturing particularly silicon-germanium alloys among the materials for the direct conversion of thermal energy and electric energy, i.e. thermoelectric materials.

As a process for manufacturing a silicon-germanium alloy as a thermoelectric material there can be mentioned a powder sintering process as disclosed in R.A. Lefever, G.L. McVay and R.J. Baughman: "Preparation of Hot-Pressed Silicon-Germanium Ingot: Part III-Vacuum Hot Pressing", Materials Research Bulletin 9 863 (1974), and its series (Part I and Part II). According to this literature the powder sintering process comprises the following steps:

(1) a. step of melting metallic silicon, metallic germanium and doping material, (2) a step of cooling the melt obtained in step (1), (3) a step of crushing a silicon-germanium alloy obtained in step (2) to particles of about 10 mesh, (4) a step of grinding down the silicon-germanium alloy particles obtained in step (3) into further fine particles, and (5) a step of hot pressing the silicon-germanium alloy particles obtained in:. step (4), in a vacuum vessel of not higher than $10^{-5}$ torr at about 1300° C. and under a high pressure of about 2000 kg/cm$^2$.

On the other hand, Japanese Patent Kokai (Early Disclosure) No. 190077/83 discloses an invention relating to a thermoelectric material consisting of a non-single crystalline solid solution comprising a plurality of elements, and an example therein describes a process for producing Si$_x$Ge$_y$B$_z$ (x+y+z=1). According to said process, material gases of SiH$_4$, SeH$_4$, and B$_2$H$_6$ are introduced into a vacuum vessel with H$_2$ carrier gas, and they are decomposed in the vessel thereby to obtain a ternary amorphous crystal consisting of Si, Ge and B at the growth rate of 50 Å/min. Thus there may also be mentioned a process in which a gaseous compound is used as material and it is decomposed in a vapor phase in a vacuum vessel to obtain a thermoelectric material.

The powder sintering process, one of the above-mentioned processes for manufacturing thermoelectric materials, takes complicated processes as described above, and it requires particular manufacturing conditions such as high temperature not lower than 1400° C. in the melting step of material, high temperature near 1300° C. and high pressure of about 2000 kg/cm$^2$ in the hot pressing step, and high vacuum degree not higher than $10^{-5}$ torr, or high technical standards for achieving these conditions.

On the other hand, in the growth method according to the example of Patent Kokai No. 190077/83 where SiH$_4$, GeH$_4$ and B$_2$H$_6$ are materials and they are introduced in a vacuum vessel, the growth rate is so slow as 50 Å/min. and such rate does not answer the industrial purposes.

This invention provides means of solving the problems possessed by the conventional processes, i.e. the particular manufacturing conditions of high temperature, high pressure and high vacuum degree and means for easy industrialization whereby high yield and growth rate are ensured.

That is, the process of this invention is characterized by introducing into a reaction vessel monosilane (SiH$_4$) gas, germanium tetrachloride (GeCl$_4$) gas and doping gas of P-type or N-type and depositing a silicon-germanium alloy upon a substrate heated at a temperature higher than 750° C in the reaction vessel. Preferably, the pressure within said reaction vessel is higher than the atmospheric pressure and the material of said substrate is graphite or metal foil.

The invention will now be described in detail with reference to the accompanying drawings, in which FIG. 1 is a flow sheet of an apparatus for carrying out the process of this invention; and FIG. 2 is a schematic view of a thermoelectric test element made for trial of a silicon-germanium alloy obtained by the present process.

As well be seen from FIG. 1, the H$_2$ gas, SiH$_4$ gas, doping gas and H$_2$ gas of the gases used in the invention are supplied through pipes 1, 2, 3 and 4 Reference numerals 11, 12 and 13 are the flow controllers of the respective gases. The hydrogen supplied through the pipe 4 is used for the substitution of gases in the apparatus and as a carrier gas of GeCl$_4$ stored in a vessel 40.

Firstly, a substrate 31 is set in a reaction vessel 32. Before growing, the interior of the reaction vessel is made vacuum by a vacuum pump 23, and it is converted by H$_2$, and thereafter a predetermined amount of H$_2$ is flown. The H$_2$ is set to a predetermined pressure by a constant pressure inlet valve and then discharged. At the same time during this operation, the SiH$_4$ and doping gas in the same amount as in the initial growth conditions, and in addition GeCl$_4$ carrying with the H$_2$ carrier gas are flown from a purge line 50 into an adsorption apparatus 27. The substrate is supplied with electricity from a power source 35 and raised to a desired temperature. The substrate is controlled at a constant temperature by means of a pyrometer 34 for temperature control through a sight hole 33. Growth is effected by stopping the flow H$_2$ and introducing into the reaction vessel the material gases flowing in the purge line 50. After the finishing of the growth, the flow of the material gases is stopped and only H$_2$ as the carrier gas is flowed. After the lapse of desired time the temperature of the substrate is lowered. After the complete lowering of the temperature of the substrate, N$_2$ is flown into the reaction vessel thereby to convert the interior of the vessel with N$_2$. To ensure a complete conversion, then the interior of the reaction vessel is converted with N$_2$ by a vacuum pump, when the product is discharged.

According to the process for manufacturing silicon-germanium alloys as thermoelectric material it is possible to obtain homogeneous silicon-germanium alloys through the following actions. That is, the gases within the reaction vessel become homogeneous in that a gaseous compound as material is used and the material is sufficiently stirred thanks to the natural convection within the reaction vessel. Then the material gases reach the surface of the substrate, where said gases are subject to thermal energy possessed by the substrate thereby to be decomposed, when an aimed silicon-germanium alloy successively deposits on the surface of the substrate. Since the silicon-germanium alloy does not pass through a molten state at that time it is not subject to segregation, and as the result it is possible to obtain a homogeneous silicon-germanium alloy. Further, high growth rate and/or high yield are ensured by the natural convection generated in the reaction vessel in case the pressure within the vessel is particularly higher than the atmospheric pressure. The natural convection effectively consumes the material gases to achieve high growth rate or high yield.

When a polycrystalline silicon for semiconductors is manufactured relying on thermal decomposition of SiH$_4$ it is considered that the suitable temperature for the surface of the substrate is in the range from 750° C. to 850° C. This is because that the smoothness (hereinafter called morphology) of the surface of the substrate layer is deteriorated as the temperature rises. Accordingly, it is not allowed to raise the temperature of the substrate at random in consideration of the problem such as yield at the time of contour working. According to the present process for manufacturing a silicon-germanium alloy, however, it has been confirmed by tests that by using GeCl$_4$ gas the morphology is very good even in the case of temperature higher than that in the substrate surface at the thermal decomposition of SiH$_4$ alone. Moreover, raising of the temperature of the substrate could accelerate the growth rate. Thus, by using SiH$_4$ and GeCl$_4$ the present invention has made it possible to adopt high temperatures which may be considered usually to be abnormal, by the new actions.

EXAMPLE 1

Electricity was directly passed to a graphite substrate of 5×2×320 mm size in a reaction vessel to allow the substrate to be heated, and the substrate was maintained at 800° C. Phosphine (PH$_3$) was selected as a doping gas.

SiH$_4$ and GeCl$_4$ were flown at the rates of 7.5 Nml/min. and 33.5 mg/min. respectively. Since GeCl$_4$ is a liquid at normal temperature its flow was controlled by the flow of the carrier gas (H$_2$) and the vapor pressure of GeCl$_4$. The doping gas was flown at the rate of $4 \times 10^{-3}$ Nml/min. Further, as the silicon-germanium alloy deposited the gas flows of said SiH$_4$ and GeCl$_4$ were increased at the same rate as the surface area of the formed silicon-germanium alloy. During the reaction the interior of the vessel was retained at 1.5 atmospheric pressure.

The compositions of the alloy thus obtained were $Si_{0.82} Ge_{0.18}$ P : $1.8 \times 10^{19}$ atoms/cm$^3$, when the growth rate was 0.9 μm/min. A thermoelectric characteristic was shown in that the figure-of-merit was about $0.4 \times 10^{-3}$ deg$^{-1}$.

EXAMPLE 2

Except that the temperature of the graphite substrate was 900° C and the introducing rate of SiH$_4$, GeH$_4$ and PH$_3$ was quadruplicated, a manufacturing test was effected under the same conditions as in Example 1.

The compositions of the alloy thus obtained were $Si_{0.79} Ge_{0.21}$ P : $1.7 \times 10^{19}$ atoms/cm$^3$, while the thermoelectric characteristic was almost the same as that obtained in Example 1. Though the yield was slightly lowered than in Example 1 the substantial growth rate was 3.8 times the value obtained in Example 1.

EXAMPLE 3

Diborane (B$_2$H$_6$) was selected as the doping gas and its introducing rate was set to $1 \times 10^{-2}$ Nml/min. Except these conditions, the manufacturing test was effected under the same conditions as in Example 2.

The compositions of the alloy thus obtained were $Si_{0.82} Ge_{0.13}$ B : $1.8 \times 10^{19}$ atoms/cm$^3$ and a good thermoelectric characteristic was shown in that the figure-of-merit was about $0.4 \times 10^{-3}$ deg$^{-1}$. Further, on the basis of the silicon-germanium alloy obtained in Example 3 and that obtained in Example 2, a pair of test elements of P-N type were prepared as shown in FIG. 2. By making the graphite substrate as it is a junction electrode at the high temperature side it was capable of obtaining a thermoelectric characteristic.

In FIG. 2, reference numeral 100 designates a graphite junction electrode at the high temperature side, reference 101 an N-type Si-Ge alloy, reference 102 a P-type Si-Ge alloy, reference 103 a copper junction electrode at the low temperature side. FIG. 2 is also a perspective illustration of a minimum unit having power generating functions.

EXAMPLE 4

Two tantalum foil sheets of 5×0.1×320 mm were overlapped to prepare a substrate. The temperature and the other manufacturing conditions of the substrate are the same as the conditions in Example 1.

The composition, phosphorus concentration and thermoelectric characteristic of the silicon-germanium alloy thus obtained were almost the same as those of the silicon-germanium alloy obtained in Example 1. The tantalum foils deposited with silicon-germanium alloy on each surface could be easily released from the interface. The tantalum foils could be used as junction electrode at high temperature side like graphite substrate.

Even in the case of niobium foil the result almost same as in Example 4 was obtained.

The process for manufacturing silicon-germanium alloys as thermoelectric material according to the invention brings about the undermentioned effects.

1) Being not subject to segregation it is possible to obtain a very homogeneous silicon-germanium alloy.

2) Since the process has no pulverizing or grinding step or no melting step, contamination caused by jig or ladle for pulverizing and grinding can be prevented.

3) The process does not require particular conditions such as high temperature, high pressure and high vacuum degree, and advanced techniques for attaining them, so that manufacturing equipment is small scale and less consuming members will do.

4) Since the manufacturing steps become simple it is possible to decrease inspection items in each step and administrative items in manufacturing conditions.

5) Particularly under pressures not lower than the atmospheric pressure natural convection can effectively be utilized, and therefore high growth rate and high yield can be obtained. The present process is therefore particularly useful as a process for the manufacture of silicon-germanium alloys for thermoelectric generation which uses bulk.

6) By monitoring exhaust gas by gas chromatograph or the like during the manufacturing operation it is possible easily to administer the manufacturing conditions of a silicon-germanium alloy.

7) It is possible directly to use as electrode graphite or metal foil as it is which is used as substrate. Particularly, metal foil is rich in expansion and contraction, and therefore even if it slightly differs from silicon-germanium alloys in coefficient of linear expansion the deformation can be relieved.

We claim:

1. A process for manufacturing a silicon-germanium alloy comprising introducing SiH$_4$ gas, GeCl$_4$ gas and P-type or N-type doping gas into a reaction vessel, heating a substrate up to a temperature not lower than 750°, and depositing a thickly-grown bulky silicon-germanium alloy upon the substrate within the reaction vessel.

2. A process for manufacturing a silicon-germanium alloy as set forth in claim 1 wherein the material of the substrate is graphite.

3. A process for manufacturing silicon-germanium alloy as set forth in claim 1 wherein the material of the substrate is metal foil.

* * * * *